(12) United States Patent
Frosien et al.

(10) Patent No.: US 7,629,578 B2
(45) Date of Patent: Dec. 8, 2009

(54) CHARGED PARTICLE BEAM DEVICE

(75) Inventors: Juergen Frosien, Riemerling (DE); Yacov Elgar, Sunnyvale, CA (US)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 296 days.

(21) Appl. No.: 11/675,260

(22) Filed: Feb. 15, 2007

(65) Prior Publication Data

US 2007/0194228 A1 Aug. 23, 2007

(30) Foreign Application Priority Data

Feb. 23, 2006 (EP) ................... 06003722

(51) Int. Cl.
*H01J 37/26* (2006.01)
(52) U.S. Cl. ................... 250/310; 250/306; 250/307
(58) Field of Classification Search ............... 250/310, 250/307, 492.21
See application file for complete search history.

(56) References Cited

U.S. PATENT DOCUMENTS

| 5,447,614 | A | | 9/1995 | Hamamura et al. | |
|---|---|---|---|---|---|
| 5,956,565 | A | * | 9/1999 | Yamashita | 438/14 |
| 6,190,062 | B1 | | 2/2001 | Subramanian et al. | |
| 2002/0053353 | A1 | * | 5/2002 | Kawata et al. | 134/1.3 |
| 2005/0173631 | A1 | * | 8/2005 | Ray et al. | 250/307 |
| 2007/0018099 | A1 | * | 1/2007 | Chitturi et al. | 250/310 |

FOREIGN PATENT DOCUMENTS

| EP | 0969493 A | 1/2000 |
|---|---|---|
| EP | 1439564 A | 7/2004 |
| EP | 1577927 A | 9/2005 |
| JP | 59224548 A | 12/1984 |
| JP | 10154478 A | 6/1998 |
| WO | WO2004/068538 A2 | 8/2004 |

OTHER PUBLICATIONS

European Search Report for EP Application No. 06003722, Nov. 3, 2006.
XP-002391801, Japan, Jun. 9, 1998, Hitachi Ltd.

* cited by examiner

*Primary Examiner*—Nikita Wells
*Assistant Examiner*—Johnnie L Smith
(74) *Attorney, Agent, or Firm*—Patterson & Sheridan, L.L.P.

(57) ABSTRACT

The invention provides a charged particle beam device for irradiating a specimen, comprising a particle source for providing a beam of charged particles, an optical device for directing the beam of charged particles onto the specimen and an ozone unit for reducing the charging and/or contamination of the specimen. The ozone unit comprises a supply of ozone and a specimen nozzle unit for directing an ozone gas flow to the specimen. Further, the invention provides a charged particle beam device for irradiating a specimen comprising a particle source for providing a beam of charged particles, an optical device for directing the beam of charged particles onto the specimen, a detector and a gas unit for reducing the charging and/or contamination of the detector. The gas unit comprises a supply of gas and a detector nozzle unit for directing a gas flow to the detector. Further, the present invention provides methods for operating charged particle beam devices according to the present invention.

42 Claims, 11 Drawing Sheets

CHARGED PARTICLE BEAM DEVICE

FIELD OF THE INVENTION

The invention relates to charged particle beam devices for inspection system applications, testing system applications, lithography system applications and the like. It also relates to methods of operation thereof. More particularly, the present invention relates to a charged particle beam device and a method of operation thereof wherein the charging and/or the contamination of the specimen and/or the detector is reduced.

BACKGROUND OF THE INVENTION

Charged particle beam apparatus have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

When directing a charged particle beam onto a specimen, depending on the type, the energy, and the impinging direction of the charged particles, a plurality of interactions may occur between the charged particles and the material, in particular the surface of the specimen. These interactions may result in the emission of particles such as electrons at the place of interaction. Generally, for the following discussion, there is no need for distinguishing between secondary electrons, backscattered electrons and Auger electrons. For the purpose of simplicity, these three types of electrons will be referred to as "secondary electrons". In inspecting applications, the secondary electrons are registered at a detector which is coupled to some means for processing the information received by the secondary electrons.

However, there are, inter alia, two major problems in the state of the art that arise when directing a charged particle beam onto a specimen:

First of all, especially when working with an insulating sample, the sample is charged by the charged particle beam. Typically, in the case of electrons as charged particles, the sample becomes negatively charged whereas in the case of ions as charged particles, the sample becomes positively charged. However, it is possible that the specimen becomes negatively charged by an ion beam or positively charged by a electron beam. The charging is also dependent on the material of the specimen, the charged particle beam energy, and the inclination of the specimen regarding the imaging primary particle beam. The more insulating the material is, the more charge gathers in the sample.

The second major problem is the contamination. In general, the charged particle beam splits hydrocarbon molecules that are present in the vacuum and deposits a carbon layer on the sample and the detector. This contamination damages the detector and/or the sample and results in a bad imaging quality. In particular, in electron beam inspection the detector has to accept several tens or hundreds of nano-ampere detection currents which form carbon layers on the detector and reduce the lifetime. Typically, applied detectors in electron beam inspection are pin diodes whose sensitivity is largely influenced by carbon layers.

In the state of the art, there are several methods known to drain the charging of a specimen. For example, DE 33 32 248 A1 teaches to direct a gas flow onto the specimen surface. Due to the interaction with the charged particle beam, the gas molecules are ionized into positive ions and electrons. As the electrons have low energy, they are rejected by the negatively charged specimen surface, whereas the positively charged ions are attracted by the specimen where they absorb electrons from the specimen's surface. Thereafter, the now uncharged gas molecules are pumped away from the specimen surface.

U.S. Pat. No. 6,555,815 B2 describes a method wherein inert gases such as $N_2$, $CO_2$, $SF_6$, or noble gases are injected onto the sample's surface. According to WO 98/32153 an inert gas is injected into the scanning electron microscope at the point where the electron beam impinges the specimen to neutralize a charge build-up on the specimen by the ionization of the inert gas by the electron beam. Further, WO 98/32153 teaches to flood the scan region with positive charge for a number of frame cycles between scan frames, thereby reducing the positive charged build-up on the specimen. An apparatus for particle beam induced modification of a specimen is described in U.S. Pat. No. 6,182,605. Therein, it is advised to supply a gas, such as Dimethyl-gold-trifluoro-acetylacetonate, in the modification area of the specimen which creates a gas atmosphere in the beam interaction area of the specimen. Due to the interaction of the particle beam with the gas molecules, chemically active atoms and radicals will be generated, which can interact with the specimen in the area of the beam interaction.

In order to overcome the contamination problem described before, U.S. Pat. No. 5,981,960 teaches a method and apparatus wherein ozone gas is introduced into the chamber through which the charged particle beam is passed, shaped and deflected. The gas is supposed to be irradiated to the desired location while the charged particle beam is irradiated through the chamber. A charge-up drift due to a contamination material from a resist on a wafer can be avoided by the ozone self cleaning. Furthermore, U.S. Pat. No. 5,312,519 and U.S. Pat. No. 5,466,942 disclose methods of cleaning a charged beam apparatus wherein ozone is introduced into the chambers of the charged particle beam apparatus. The problem is, however, that the cathodes are generally very sensitive to gas, in particular to oxygen exposure. Hence, the ozone must be prevented from coming into contact with the cathodes. This problem is partly overcome e.g. by the U.S. Pat. No. 5,981,960 by providing the charged particle beam apparatus with several chambers.

The problems in the state of the art are especially challenging in high current density, low voltage electron beam systems used e.g. in electron beam wafer and mask inspection and metrology. In those applications, the specimen is rapidly charged due to the high current. Additionally, due to the low voltage, in comparison to high voltage beam systems, the charging is relatively large thus redirecting the charged particles. This, in turn, results in a bad imaging quality. Moreover, the high current low voltage probe is generated by thermal field emission (Schottky) or cold filed emission cathodes. These cathode types, however, are very sensitive to gas, in particular to oxygen exposure.

Accordingly, it is an object of the present invention to overcome at least part of the problems in the state of the art. It is particularly an object of the present to provide a charged particle beam apparatus and a method of operating thereof that reduces the charging and/or contamination effects.

SUMMARY OF THE INVENTION

The present invention provides an improved charged particle system. According to aspects of the present invention, charged particle beam apparatus according to independent claims 1 and 9, and methods of operating a charged particle beam device according to independent claim 27 are provided.

Further advantages, features, aspects and details of the invention are evident from the dependent claims, the description and the accompanying drawings.

According to one aspect, a charged particle beam device for irradiating a specimen is provided that comprises a particle source for providing a beam of charged particles, an optical device for directing the beam of charged particles onto the specimen, and an ozone unit for reducing the charging and/or contamination of the specimen, wherein the unit comprises a supply of ozone and a specimen nozzle unit for directing an ozone gas flow to the specimen.

According to another aspect, a charged particle beam device for irradiating a specimen is provided that comprises a particle source for providing a beam of charged particles, an optical device for directing the beam of charged particles onto the specimen, a detector for detecting secondary charged particles, and a gas unit for reducing the charging and/or contamination of the detector, wherein the unit comprises a supply of gas and a detector nozzle unit for directing a gas flow to the detector.

According to yet another aspect, a method for irradiating a specimen is provided that comprises:
  providing a charged particle beam;
  directing the charged particle beam onto the specimen;
  directing an ozone gas flow to the specimen.

According to an even further aspect, a method for irradiating a specimen is provided, wherein the method comprises:
  providing a charged particle beam;
  directing the charged particle beam onto the specimen;
  detecting secondary charged particles from the specimen; and
  directing a gas flow to the place where detecting of the secondary charged particles takes place.

Irradiating a specimen according to the present invention may be understood as modifying a specimen. Typical modifying applications are structuring a specimen or exposing a resist to the charged particle beam. Also lithography is a typical application of the present invention. Irradiating a specimen may also be understood as imaging a specimen, e.g. in order to inspect it.

According to typical embodiments, the nozzle unit of the present invention may comprise one or several nozzles and/or capillary tubes. The nozzle unit may be integrated into an optical device, such as an electrode, or a charge control cap. According to typical embodiments, the gas supply may comprise a gas flow control and a gas generator, which is coupled to a generator supply such as an oxygen tank. The specimen may be mounted on a specimen table which typically provides for a tilt mechanism in order to vary the inclination angle between the charged particle beam and the specimen. Alternatively or additionally, the optical column may be tiltable in order to vary the angle between charged particle beam and specimen. The ozone gas is to be understood as a gas providing a non negligible share of ozone molecules. The typical amount of ozone in the ozone gas is between 0.1% and 10%, e.g. more than 0.2% and less than or equal to 1%. That is, the share of ozone in the ozone gas is typically to be chosen such that operating the charged particle beam according to the present invention benefits from the interactions of the ozone with the specimen and/or detector. However, depending on the application, higher concentrations of even more than 10%, 15% or 20% may be used. In typical embodiments, the charged particle beam device of the present invention comprises one or more pumps for drawing off the gas and/or generating a low pressure. Further, at least one aperture may be provided. Typically, the detector nozzle unit may be situated close to the detector whereas the specimen nozzle unit may be situated close to the specimen.

The invention is also directed to apparatuses for carrying out the disclosed methods, including apparatus parts for performing each of the described method steps. These method steps may be performed by way of hardware components; a computer programmed by appropriate software; by any combination of the two; or in any other manner. Furthermore, the invention is also directed to methods by which the described apparatus operates. It includes method steps for carrying out every function of the apparatus.

BRIEF DESCRIPTION OF THE DRAWINGS

Some of the above indicated and other more detailed aspects of the invention will be described in the following description and partially illustrated with reference to the figures. Therein:

FIGS. 6b-6c show different embodiments of the charge control cap shown in FIG. 6a;

DETAILED DESCRIPTION OF THE DRAWINGS

Without limiting the scope of protection of the present application, in the following the charged particle beam device or components thereof will exemplarily be referred to as an electron beam device or components thereof. Thereby, the electron beam might be utilized especially for inspection, review or metrology. The present invention can still be applied for apparatuses and components using other sources of charged particles, such as ions, and/or other secondary and/or backscattered charged particles to obtain a specimen image.

Typically, the present invention relates to particle beam inspection systems having high probe currents as well as a high detection efficiency and, resulting therefrom, high detection speeds. Specifically, the present invention relates to electron beam systems.

Within the following description of the drawings, the same reference numbers refer to the same components. Generally, only the differences with respect to the individual embodiments are described.

Figure 1A:
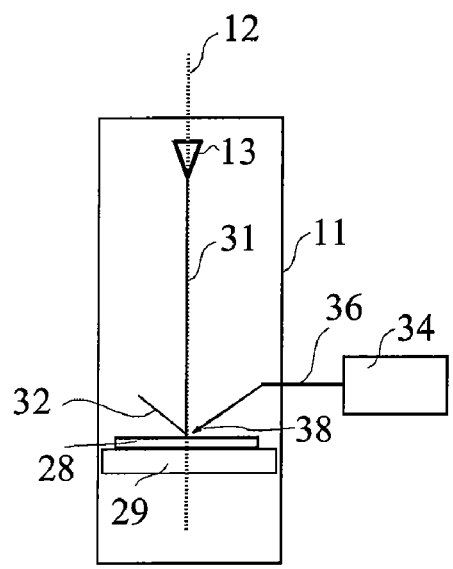
FIGS. 1a-1b show a first and second embodiment of the present invention.

FIG. 1a shows a first embodiment of the present invention. Therein, electron beam source 13 emits a beam 31 of electrons travelling along the optical axis 12 until impinging on the specimen 28 which rests on the specimen stage 29. Due to the interaction of specimen material with the electrons, secondary electrons 32 are emitted at the position of interaction. Due to the negatively charged electrons, the specimen, especially if it is highly insulating, becomes charged. Furthermore, the electrons split hydrocarbon molecules, resulting in a deposit of a carbon layer on the sample 28. In order to reduce the charging and contamination, according to the present invention, an ozone gas flow is directed onto the specimen. The ozone gas is supplied by supply 34, and is led to the vicinity of the position of impingement of the electrons on the specimen by a hose, tube, channel, duct, canal, pipe, or the like, or a combination thereof. For simplicity, all means for transporting the gas flow shall be called feed pipes henceforth. A nozzle unit 38 is attached to the end of the feed pipes 36 which allows the production of a directed cloud of ozone gas surrounding the position of electron impingement at the specimen. In general, and not limited to this embodiment, the nozzle unit may also be the opening of a small diameter pipe. The nozzle unit is typically situated close to the specimen. All or part of the electron beam device may be situated within a vacuum chamber 11 providing a certain level of low pressure.

The ozone gas which is exhausted to the electron beam close to the specimen acts in two ways. On the one hand, it is split to ions which bleed off charge from the sample. On the other hand, it interacts with the undesired carbon layer on the surface of the specimen, thereby taking away the carbon from the surface. In this way, both the effects of charging and contamination are reduced or avoided, resulting in an improved imaging quality. Moreover, as the gas flow is directed to the position of impingement of the electrons on the specimen by the nozzle unit, the ozone sensitive cathode can be prevented from getting into contact with the ozone gas, in particular the ozone therein and other components such as oxygen. This, in turn, increases the life time and operation effectiveness of the cathode and other parts of the charged particle beam device that are sensitive to the exposure to oxygen compounds.

In general, the present invention may be particularly advantageous if the specimen is a mask. In this case, the apparatus and methods according to the present invention allow for the reduction of mask contamination. Further, the apparatus and methods of the present invention specifically allow for the reduction of negative charging.

Figure 1B:
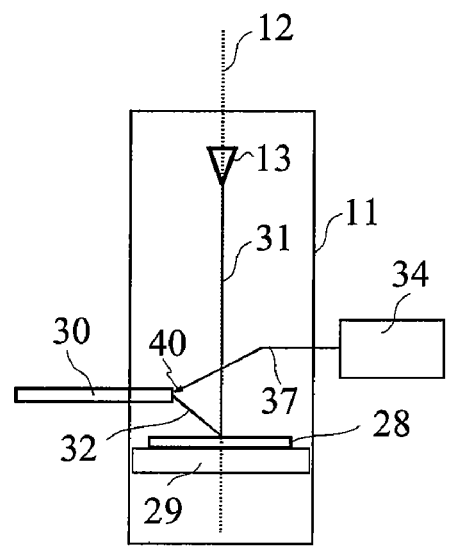

FIG. 1b shows a second embodiment of the present invention. Therein, electron beam source 13 emits a beam 31 of electrons travelling along the optical axis 12 until impinging on the specimen 28 which rests on the specimen stage 29. Due to the interaction of specimen material with the electrons, secondary electrons 32 are emitted at the position of interaction and are detected at detector 30. In general, and not limited to this embodiment, the measurement of secondary electrons can be conducted with detectors in the form of scintillators connected to photomultiplier tubes or the like. Detection signals are processed by a processing unit (not shown) that may have image processing capabilities and is capable of processing the detection signals in various manners. A typical processing scheme includes generating a voltage signal that reflects the amplitude of the detection signal against the scan direction. The voltage signal may be further processed to determine locations of at least one edge and/or other cross sectional features of the inspected structural elements.

The electrons split hydrocarbon molecules which are present in the atmosphere in the region between the specimen and the detector, resulting in a deposit of a carbon layer on the detector 30. This deposition of carbon is a contamination of the detector resulting in a reduced sensitivity and stability of the detector. In practical applications, this is one reason why the life time of a detector is short and it has to be exchanged from time to time. In order to reduce the contamination of the detector, according to the present invention, a flow of gas is directed onto the detector. For instance, the gas may be ozone. However, other gases are also applicable. The gas is supplied by supply 34, which is directed to the vicinity of the detector specimen by a hose, tube, channel, duct, canal, pipe, or the like, or a combination thereof. For simplicity, all means for transporting the gas flow shall be called feed pipes henceforth. A nozzle unit 40 is attached to the end of the feed pipes 37 which allows the production of a directed cloud of gas surrounding the position of impingement of the secondary electrons 32 onto the detector 30. The nozzle unit is typically situated close to the detector. All or part of the electron beam device may be situated within a vacuum chamber 11 providing a certain level of vacuum.

Due to the gas flow flowing to and along the detector, the effect of contamination of the detectors can be reduced or even avoided. As a consequence, the life time of the detector is increased and the detector does not have to be exchanged as often as before. Also charging of the detector is reduced which may be caused by contamination. A typical gas used in these applications is ozone because it is highly reactive. Other gases are also applicable. Thereby, the gas is used both to prevent carbon from depositing on the detector surface and, depending on the reactivity of the gas applied, to carry away carbon already deposited on the detector surface.

Figure 2:
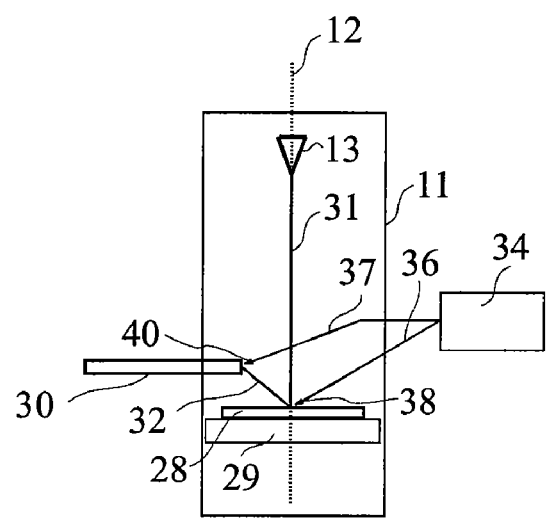
FIG. 2 shows a third embodiment of the present invention.

FIG. 2 shows a further embodiment of the present invention. Therein, the gas flow from the supply 34 is directed via the feed pipe 36 and the specimen nozzle unit 38 to the specimen 28. Further, the gas flow is directed via the feed pipe 37 and the detector nozzle unit 40 to the detector 30. As will be described in more detail in FIGS. 4a-4e, the supply 34 can consist of one supply or two separated supplies such as two gas tanks. Also, the feed pipes 36 and 37 for feeding the detector nozzle unit and the detector nozzle unit may comprise common feed pipe sections. Further, some means for controlling the gas flow may be arranged between supply and detector nozzle unit and/or specimen nozzle unit (see FIG. 4b, 4c, 4e).

The embodiment shown in FIG. 2 is particularly advantageous as the arrangement shown allows for the reduction of charging and/or contamination of the sample and/or the detector. The imaging quality can be largely improved in comparison to apparatus known in the state of the art.

Figure 3A:
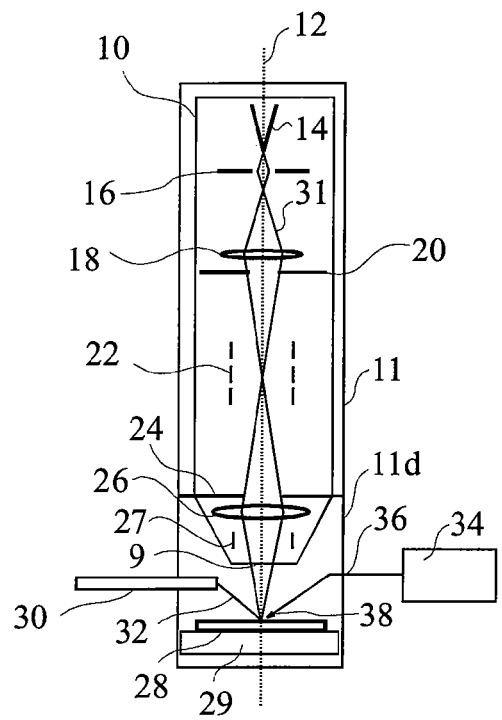
FIGS. 3a-3c show further embodiments of the present invention.
Figure 3B:
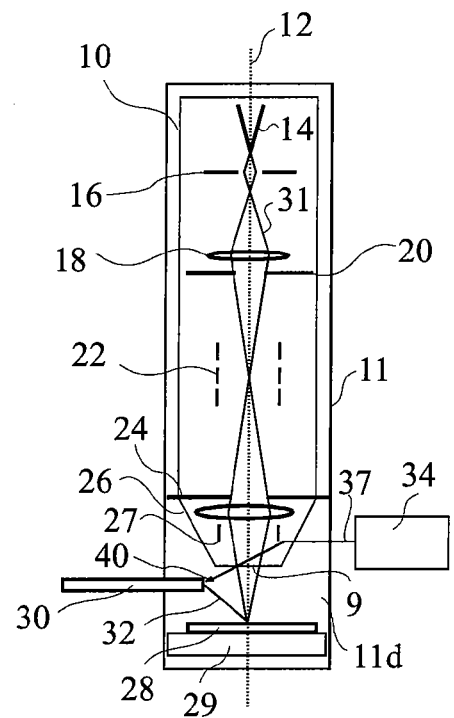
Figure 3C:
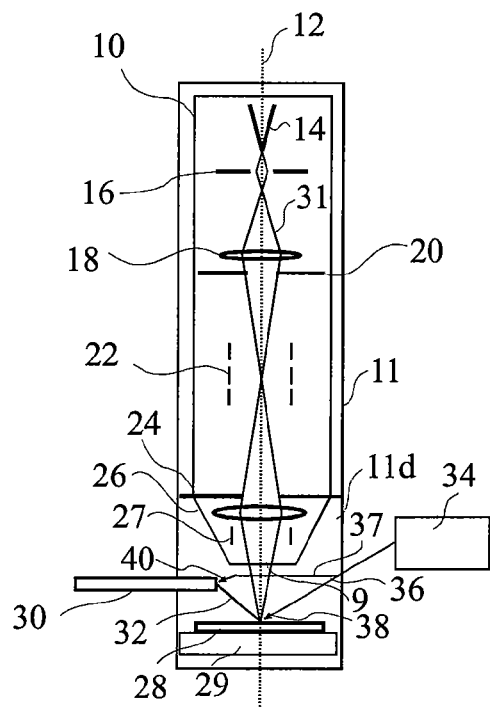

FIG. 3a-c show further embodiments of the present invention. The electrons are emitted by the cathode 14 and accelerated to the anode 16. The beam of electrons 31, while propagating along the optical axis 12, is led through a multitude of optical devices.

In general, and not limited to the embodiments shown, the beam may be focused, condensed, collimated, aligned, filtered, de- and/or accelerated, deflected, stigmated etc. In order to do so, one or more of the group consisting of the following optical devices may be arranged on the beam path: Magnetic lenses, electrostatic lenses, compound magnetic-electrostatic lenses, Wien filters, condensers, aligners, collimators, deflectors, accelerators, decelerators etc.

In FIGS. 3a-3c, some of these optical devices are exemplarily demonstrated: Lens 18, such as a condenser lens, aperture 20, aligner/deflector 22, aperture 24, lens 26, deflector 27. It shall be emphasized that this arrangement is only an example and that further optical devices, e.g. a collimator or a filter, may also be provided. In general, the deflector may be arranged prior or after the focus lens. In applications where the working distance between sample and focus length shall be minimized, it is desirable to arrange the deflector prior to the focus lens. The optical devices as shown are arranged within the optical column 10. The optical column may provide for a high vacuum level. As will be explained in more detail below in respect to FIGS. 7a and 7b, it is possible to have different levels of vacuum in the charged particle beam device. Differential pumping aperture 9 separates the optical column 10 from the specimen chamber, i.e. the chamber in which the specimen is located. Generally, it is possible to provide also a de-accelerating electrode (not shown) in the lower part of the optical column, such as adjacent to or within the objective lens. In FIGS. 3a-3c, number 26 refers to the objective lens. A de-accelerating electrode usually reduces the kinetic energy of electrons that are previously accelerated by the anode. In FIGS. 3a-3c, reference number 16 refers to the anode.

In the embodiment shown in FIG. 3a, ozone gas from supply 34 is led to the specimen 28 via feed pipes 36 and directed to the place of impingement of the electrons on the specimen by nozzle unit 38.

In the embodiment shown in FIG. 3b, gas from supply 34 is led to the detector via feed pipes 37 and directed to the detector surface by nozzle unit 40. Typically, the gas may comprise ozone that is, for instance, generated by an ozone generator which is fed by molecular oxygen.

In the embodiment shown in FIG. 3c, gas from supply 34 is led to both the specimen 28 via feed pipes 36 and the detector 30 via feed pipes 37. It is directed to the place of impingement of the electrons on the specimen by nozzle unit 38 and to the detector surface by nozzle unit 40. Typically, the gas may comprise ozone that is, for instance, generated by an ozone generator which is fed by molecular oxygen.

FIGS. 4a-4e show different embodiments of the gas supply 34.

Figure 4A:
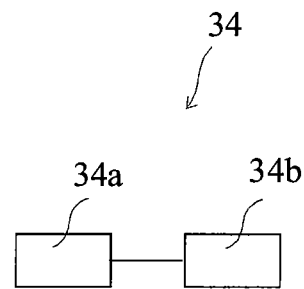
FIGS. 4a-4e show different embodiments of gas supplies.

FIG. 4a shows a two-part embodiment of the gas supply 34 wherein 34a refers to a gas generator and 34b to a generator supply. For instance, allow the gas in question to be ozone, which is generated in the generator 34a acting as an ozone generator. The generator 34a may, for instance, be fed with oxygen $O_2$ which can be taken, for example, from the generator supply 34b such as an oxygen tank. Alternatively, the generator 34a may be fed with air or other gaseous, liquid or solid material which comprises oxygen atoms that can be disassociated in order to form ozone.

Figure 4B:
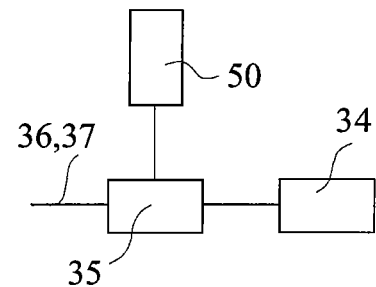

FIG. 4b shows the gas supply 34 which is connected to the gas flow controller 35. The gas flow controller controls the flow of gas through the feed pipes 36 and/or 37. In general, the gas flow controller according to the present invention may be operated in the following modes:

a) Continuous mode: The gas flow is held constant.
b) Pulsed mode: The gas flow is periodically changing over time. Typical pulse periods are between 1 and 100 seconds, e.g. 5, 10, or 50 seconds, or even 70 or 85 seconds. However, depending on the application, smaller or larger pulse periods than the ones given above may also be used. The pulsed mode may comprise intervals with no gas flow at all. On the other hand, it may comprise intervals with a maximum gas flow. It may also comprise intervals where the gas flow is steadily increasing or decreasing. Further, it may also have the shape of a step function or the like. Furthermore, the pulse may be controlled by the operator of the charged particle beam device or may be triggered by another signal. For instance, a single pulse of gas flow may be activated prior to image acquisition.
c) Supervised mode: The gas flow may be controlled by the operator of the charged particle beam device. Alternatively, or supplementary, the gas flow may be triggered by another signal. Such a signal could stem from a sensor which sensors one ore more factors that may have an influence on the gas flow density and velocity. For instance, the gas flow could be triggered by the exchange operation of a sample. In one embodiment, the gas flow is stopped when the inspected sample is unloaded and the new sample is loaded for inspection and/or structuring. The gas flow at the detector could also be triggered by a signal from the detector. In one embodiment, if the detector signal is below a certain threshold, the gas flow to the detector could be initiated or increased. According to other embodiments, the gas flow is triggered by the detector current density or by the charging behavior of the sample. These embodiments are only examples for the supervised mode. It is to be understood that also other magnitudes could be used as a trigger for the gas flow controller. In particular, every combination of the embodiments described is possible. For instance, the gas flow controller could be triggered by the sample exchange operation and the charging of the specimen.

The gas flow controller may control the density of the gas molecules and/or the velocity of the gas molecules when exiting the detector nozzle unit and/or the specimen nozzle unit.

In FIG. 4b, a sensor 50 is shown connected to the gas flow controller 35. The sensor may provide the controller with any information needed or helpful in controlling the gas flow. In particular, the sensor may provide the controller with trigger information such as described previously under paragraph c). Such a sensor may be applied in all embodiments of the present invention that are described herein. In the following, for the purpose of simplicity, it has been omitted from the drawings and the description.

Figure 4C:
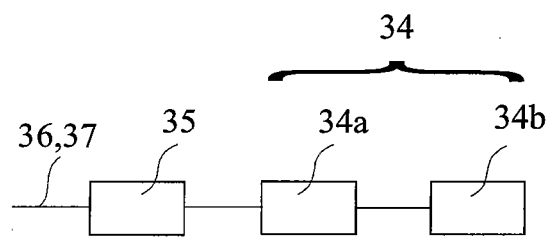

FIG. 4c shows the embodiment of FIG. 4b wherein the gas supply 34 comprises the generator 34a and generator supply 34b explained in FIG. 4a.

Figure 4D:
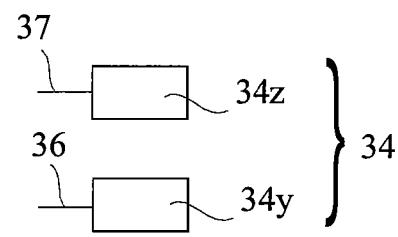

As shown in FIG. 4d, the gas flow supply 34 may also comprise parallel gas flow supplies 34y and 34z. This is one of the typical arrangements in those embodiments wherein a gas flow is directed to both the sample and the detector. In this case, for instance, gas supply 34z could supply the detector nozzle unit 40 with gas via the feed pipes 37 whereas gas supply 34y could supply the sample nozzle unit 38 with gas via the feed pipes 36. Each or at least one of the supplies 34y and 34z may comprise a generator 34a and a generator supply 34b. Alternatively, the supplies 34a and/or 34b could be tanks filled with liquid such as ozone tanks. In addition, whereas the gas supply 34y provides the specimen nozzle unit 38 with ozone gas, in certain embodiments, the gas for directing onto the detector might be a different gas such as air, oxygen, nitrogen etc.

Figure 4E:
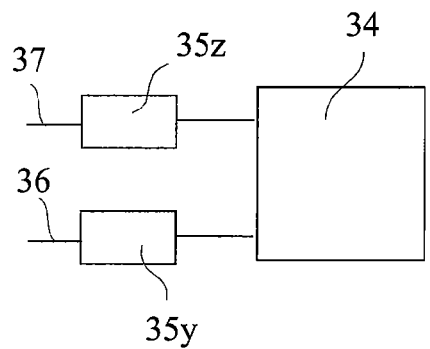
Figure 7A:
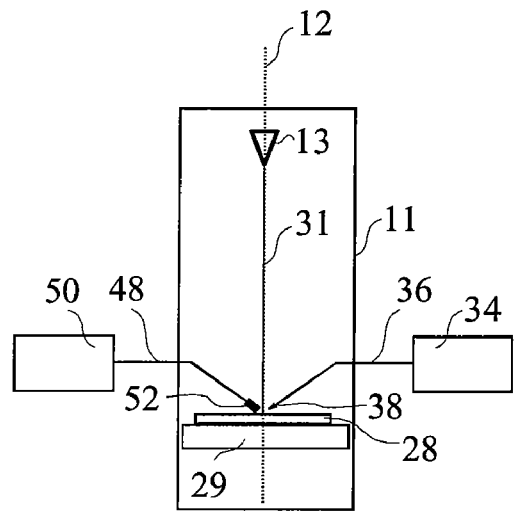
FIGS. 7a-7c show further embodiments of the present invention.
Figure 7B:
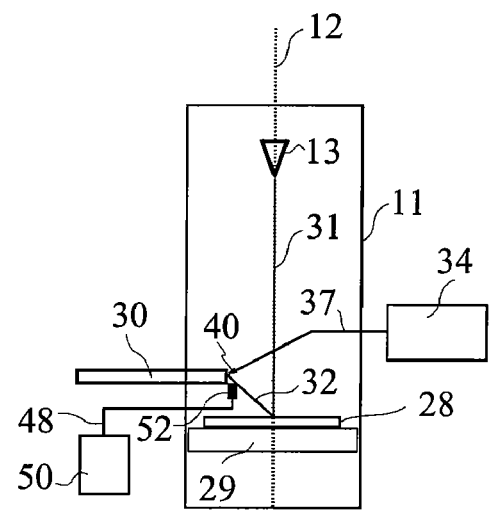

Further, to each or at least one of the gas supplies 34y and 34z an individual gas flow controller 35y and 35z may be connected as it is shown in FIG. 4e and FIG. 7b. Due to the individual control of the two gas flows, the gas flow on the detector can be actuated independently from the gas flow on the sample. Each gas flow controller may be triggered by different sensor signals. For instance, the gas flow controller responsible for the gas flow on the detector may be triggered by a current density in the detector whereas the gas flow controller responsible for the gas flow on the specimen may be triggered by the charging magnitude of the sample.

FIGS. 5a-5g show further embodiments of the present invention.

Figure 5A:
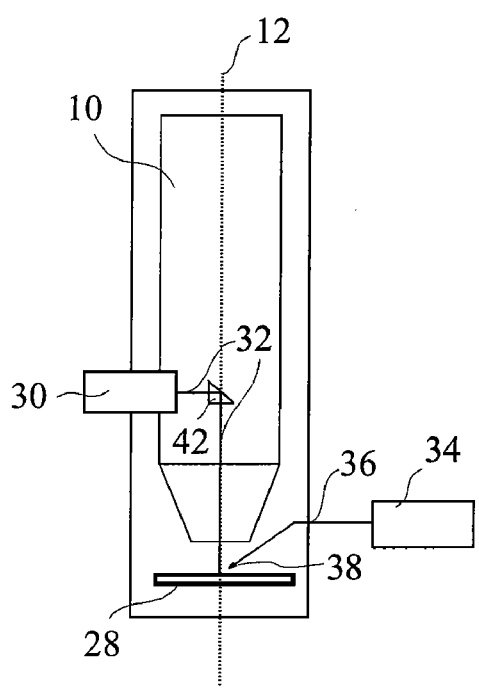
FIGS. 5a-5g show further embodiments of the present invention.

In FIG. 5a, ozone gas is directed via feed pipes 36 and the specimen nozzle unit 38 to the specimen 28. The secondary electrons which move towards the deflector 42 are deflected and keep moving until arriving at the detector.

Figure 5B:
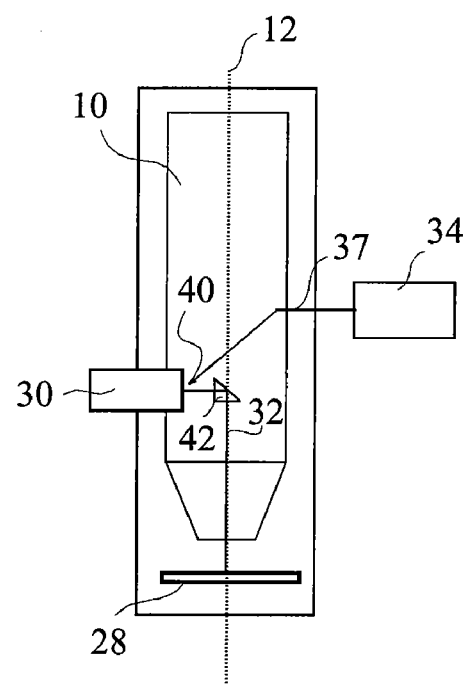

In FIG. 5b, a gas flow from the gas supply 34 is directed to the detector via feeding nozzle unit 37 and detector nozzle unit 40.

In general, in all embodiments described herein, the detector may be arranged completely or partially inside the beam column, or it may be arranged outside the beam column. For instance, in FIGS. 3a-3c the detector is positioned outside the beam column but at least partially inside the specimen vacuum chamber 8. It is also possible to arrange the detector completely inside the vacuum chamber. In FIGS. 5a-5g, the detector 30 is arranged partially inside the beam column. The position of the deflector should be such that, in case there is a gas flow directed to it, the feed pipes and the nozzle unit can be arranged without interfering with the optical devices of the charged particle beam device. Further, in all embodiments described herein, it might be useful to apply some means for deflecting, filtering and/or collecting the secondary charged particles. An example of such a means is shown in FIGS. 5a-5g with beam separator 42. The beam separator separates the beam of primary charged particles travelling towards the specimen and the beam of secondary charged particles travelling from the specimen away. A beam separator may be applied also in other embodiments of the present invention. It may be an electrostatic, magnetic, or combined electrostatic-magnetic deflector, such as a Wien-filter.

Figure 5C:
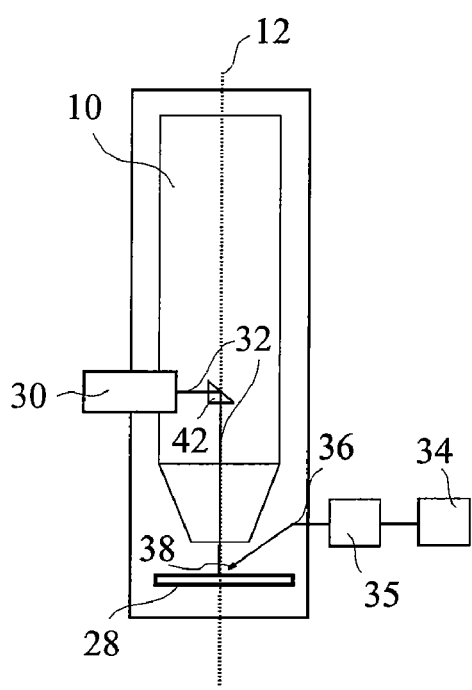

FIG. 5c shows the embodiment of FIG. 5a wherein a gas flow controller is arranged between the supply 34 and the specimen nozzle unit 38. The gas flow controller controls the supply of ozone to the specimen 28. The gas flow controller can be connected to one or more sensors as described with regard to FIGS. 4a-4e. Also, and not limited to this embodiment, the gas flow controller may comprise means for adjusting the gas flow manually by an operator.

Figure 5D:
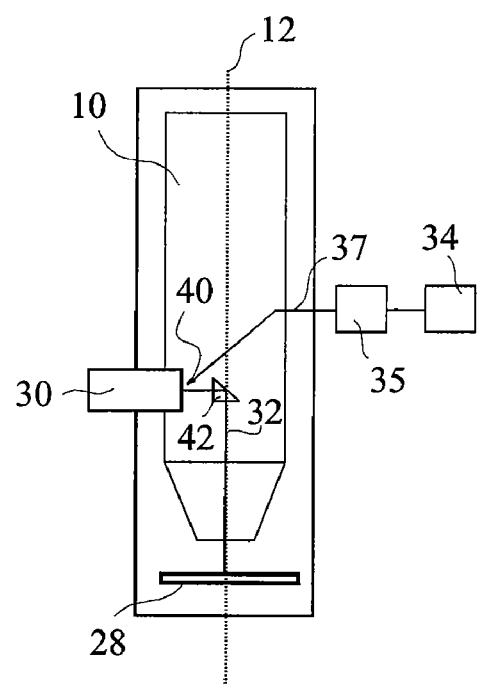

FIG. 5d shows the embodiment of FIG. 5b wherein a gas flow controller is arranged between the supply 34 and the detector nozzle unit 40. The gas flow controller controls the supply of gas to the detector 30. The gas flow controller can be connected to one or more sensors as described with regard to FIGS. 4a-4e. Also, and not limited to this embodiment, the gas flow controller may comprise means for adjusting the gas flow manually by an operator.

Figure 5E:
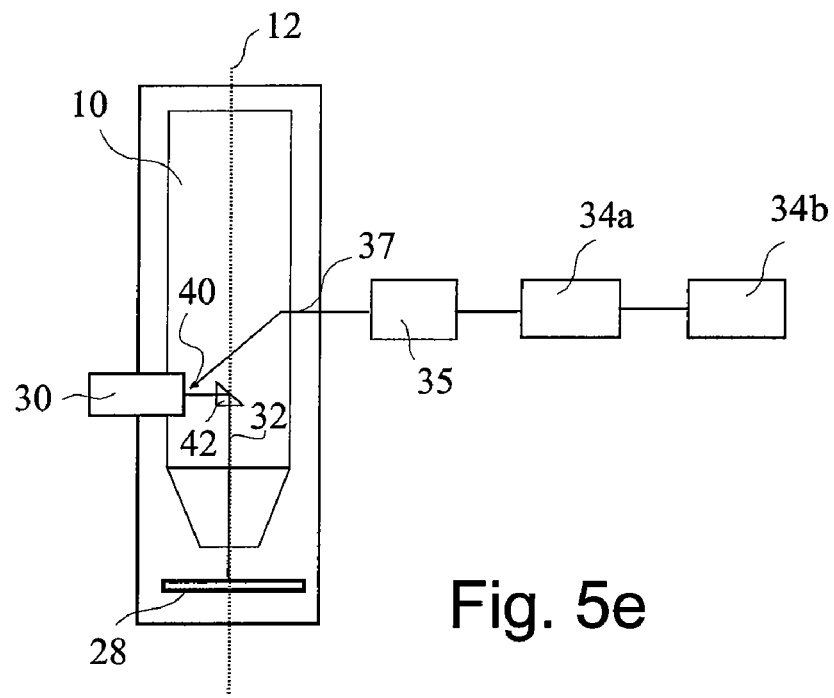

As explained with regard to FIGS. 4a-4e, the gas supply 34 may comprise a gas generator 34a and a generator supply 34b. This is also shown in FIG. 5e. In one embodiment, the gas to be directed onto the detector surface comprises ozone. In this case, the generator 34a is an ozone generator which is coupled to the generator supply 34b which is e.g. an oxygen tank or simply the air from the environment.

Figure 5F:
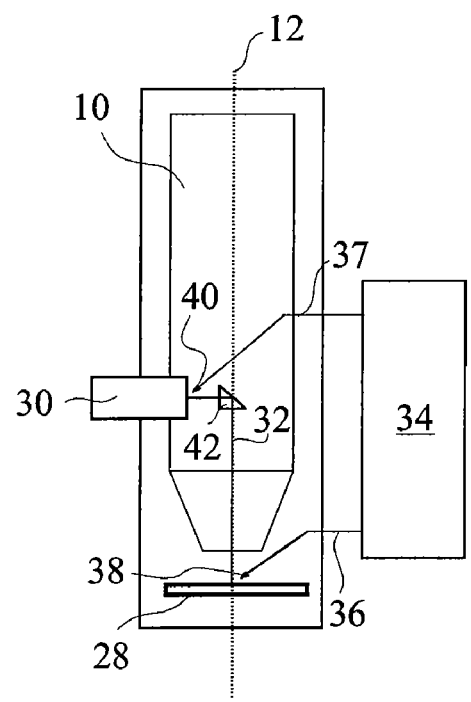

FIG. 5f shows an embodiment wherein a gas flow is directed to both the specimen and the detector. Although the gas supply 34 is shown as one common supply, it may consist of two different supplies as described with regard to FIG. 4d.

Figure 5G:
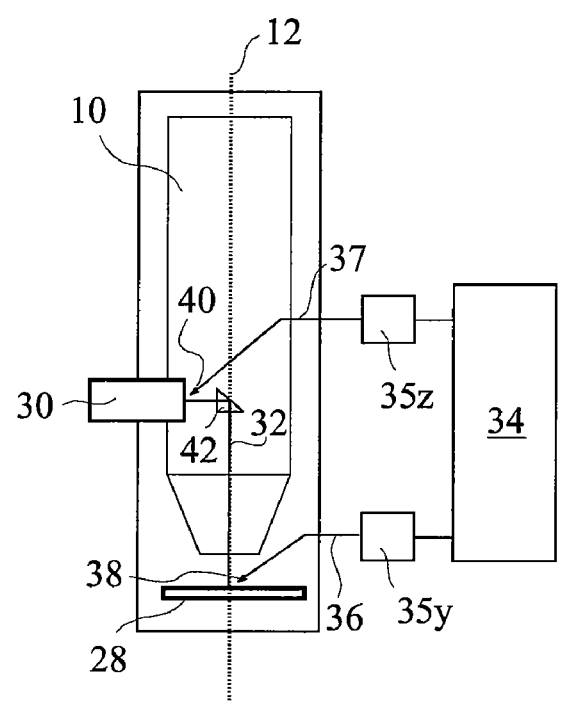

FIG. 5g shows the embodiment of FIG. 5f wherein individual controllers 35y and 35z are arranged between specimen nozzle unit 38 and gas supply 34 as well as between the detector nozzle unit 40 and the gas supply 34. The controller 35z controls the gas flow to the detector 30, whereas controller 35 controls the gas flow to the specimen 28. The gas supply 34 may comprise one or two gas generators and one or two generator supplies.

Figure 6A:
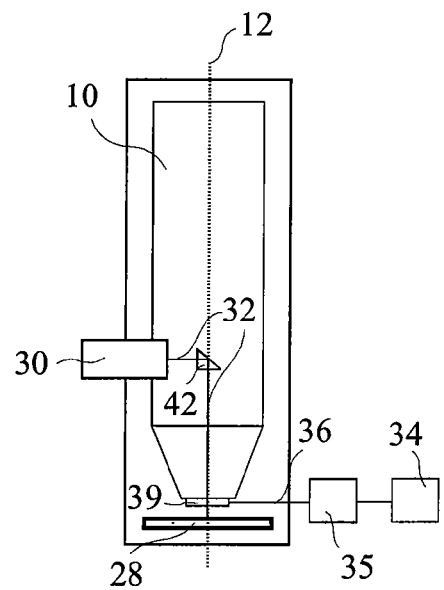
FIG. 6a shows a further embodiment of the present invention.

FIG. 6a shows a further embodiment of the present invention. In FIG. 6a, the ozone gas flow is led from the gas supply 34 via the gas flow controller 35 to the charge control cap 39.

Figures 6B, 6C:
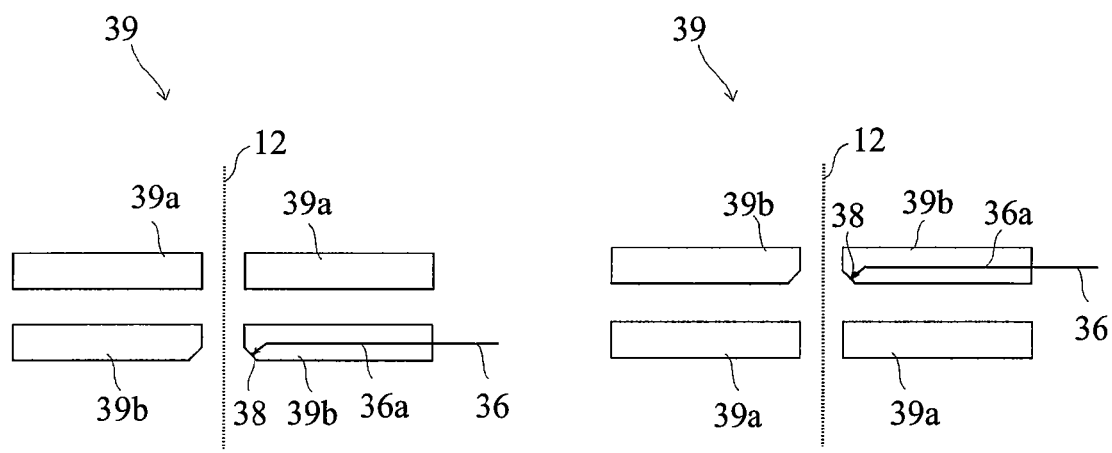

Two possible embodiments of the charge control cap 39 are shown in FIGS. 6b and 6c. The charge control cap as shown in FIG. 6b comprises a first electrode 39a and a second electrode 39b. Depending on the charging of the specimen, the first electrode and second electrode are set to different potentials. Further, the ozone feed pipe 36 is led into the electrode 39 where a channel 36a or the like is provided for allowing the ozone gas to pass to the specimen nozzle unit 38 where the gas is directed to the specimen. Further, it is possible to arrange deflector pole pieces (not shown) in parallel or besides (i.e. on the same height of the optical axis 12) the first or second electrode.

Alternatively, the second electrode 39b comprising the channel 36a may be arranged above the first electrode 39a. That is, the first electrode 39a is arranged between specimen and second electrode 39b. This arrangement is shown in FIG. 6c.

Figure 7C:
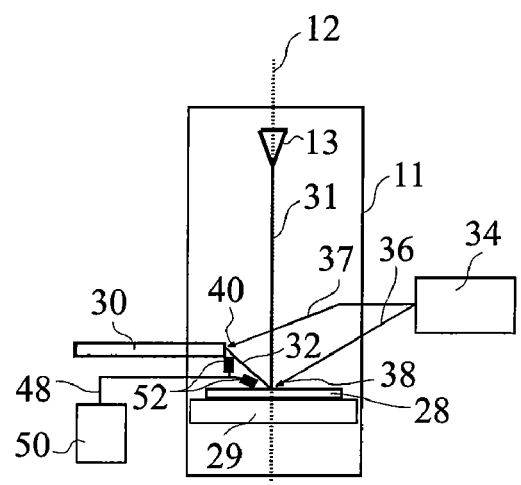

FIGS. 7a-7c show further embodiments of the present invention. As stated above, the gas used for directing to the specimen and/or detector such as ozone gas may poison and damage the source in charged particle beam devices, in particular a thermal field emission (so-called "Schottky") emitter or a cold field emitter. The present invention, in particular all embodiments described herein, provides for a local gas concentration in those areas where the gas is required. With the local supply of the gas and due to the fact that the gas is directed to the specimen and/or detector by means of a directed nozzle unit, it can be realized that only a non significant amount of the aggressive gas will reach the particle beam source.

There are several embodiments of the present invention which enhance this effect. They are exemplarily illustrated in view of the following figures. According to the embodiments as shown in FIGS. 7a-7c, a pump 50 is provided for drawing off the gas. The ozone gas which is directed to the specimen by nozzle unit 38 undergoes interaction with the specimen. Thereby the charging and/or the contamination of the specimen are reduced. After having undergone these interactions, the ozone gas needs to be removed from the specimen chamber. In order to do so, a suction opening 52 is arranged close to the specimen and connected via feed pipe 48 to the pump 50. The pump 50 refers to every device which is capable of drawing off gas. The pump may be controlled in the same modes as described above with regard to the operation of the gas flow controller. In particular, the pump may be controlled in the supervised mode. Further, the pump may be controlled synchronously with the gas flow controller.

According to the embodiment shown in FIG. 7b, the gas which is directed to the detector 30 by the nozzle unit 40 undergoes interactions with the particles contaminating the detector surface. Following this, it is drawn off by pump 50 via suction opening 52 and feed pipe 48. The pump 50 refers to every device which is capable of drawing off gas. The pump may be controlled in the same modes as described above with regard to the operation of the gas flow controller. In particular, the pump may be controlled in the supervised mode. Further, the pump may be controlled synchronously with the gas flow controller.

As shown in FIG. 7c, both the ozone directed to the specimen by nozzle unit 38 and the gas directed to the detector 30 by the nozzle unit 40 is, after having undergone interactions, sucked away by the pump 50 via feed pipes 48 and suction openings 52. The pump may be operated as described above with regard to FIG. 7*a* or FIG. 7*b*. Moreover, it is possible to arrange several pumps wherein, for instance, a first pump is connected to the suction opening arranged close to the detector, and a second pump is connected to the suction opening arranged close to the specimen.

In general, the suction opening(s) are typically arranged such that they are capable of drawing off all or the major part of the gas directed to the specimen and/or detector. Thus, a typical arrangement is shown in FIGS. 7*a*-7*c*, where the suction opening is positioned in the gas flow direction of the gas which is led to the specimen and/or detector.

Figure 8A:
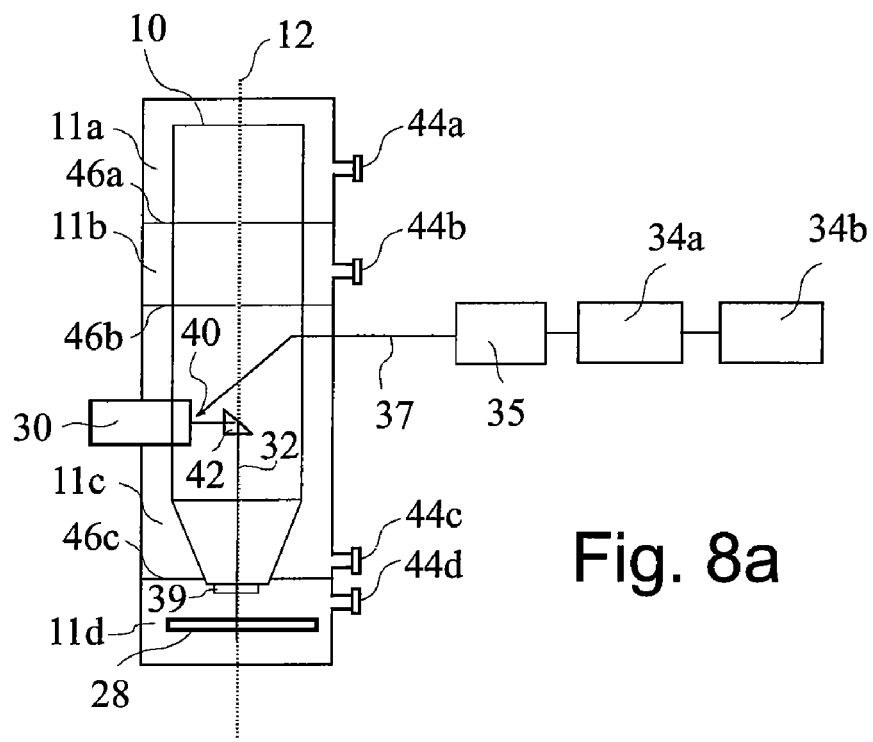
FIGS. 8a-8c show further embodiments of the present invention.
Figure 8B:
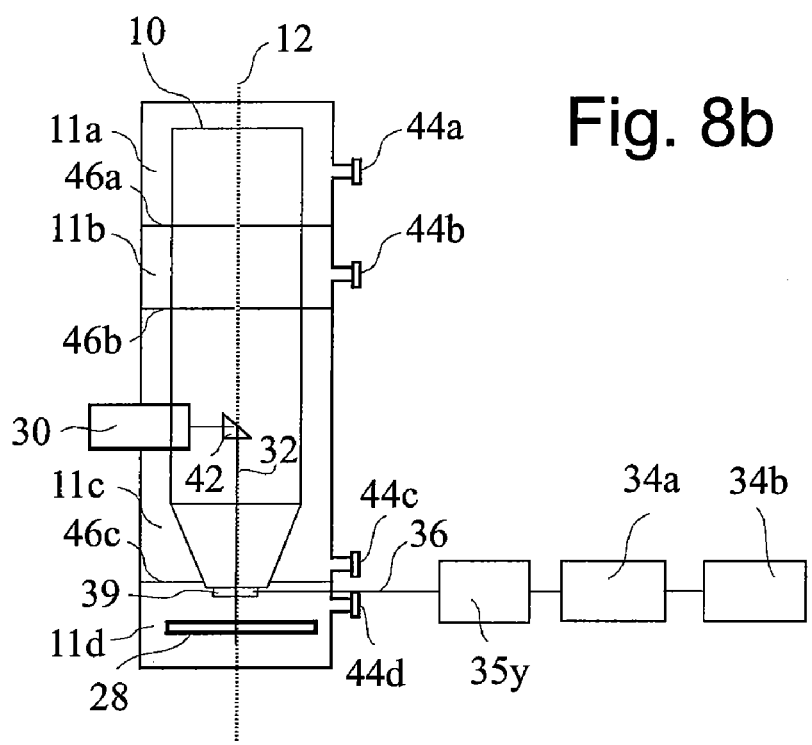

According to further embodiments shown in FIGS. 8*a*-8*b*, the protection of those parts of the charged particle beam device that are sensible to gas, such as ozone, in particular the source, can be enhanced by providing at least one differential pumping sections. The source of a charged particle beam device is particularly sensitive to gas, especially if it contains $O^-$, $O_2$ or $O_3$. Typically, these pumping sections may be arranged between the location exposed to the gas, i.e. the sample and/or the detector surface, and the particle beam source. Pumping apertures for the charged particle beam are arranged between the pumping sections. At least one of those differential pumping apertures is typically smaller than 0.5 mm. This is in particular in order to guarantee that no or only a negligible amount of gas such as ozone will reach the sensitive cathode of the source and reduce its brightness performance.

Referring to FIG. 8*a*, a flow of gas supplied by a gas generator 34*a* which is fed by a generator supply 34*b* is controlled by the gas flow controller 35*z* and led to the detector 30 via feed pipes 37. A suction opening and a respective pump as described with regard to FIGS. 7*a*-7*c* could also be provided in the embodiments of FIGS. 8*a*-8*b*. Pumps 44*a*-44*d* are arranged in order to create different levels of vacuum in the vacuum chambers 11*a*-11*d*. The chambers of different vacuum levels are separated by apertures 46*a*-46*c*. Typically, the vacuum level in the source chamber 11*a*, i.e. the chamber comprising the source of the charged particle beam device, is higher than the vacuum level in the lower chambers such as specimen chamber 11*d*.

In FIG. 8*b* ozone gas is directed to the specimen. The gas is supplied by a gas generator 34*a* which is fed by a generator supply 34*b*. The gas flow is controlled by the gas flow controller 35*y* and directed to the specimen 28 via feed pipes 36 and charge control cap 39. The charge control cap 39 shown in FIGS. 8*a*-8*b* could be, for instance, the one shown in FIG. 6*b* or FIG. 6*c*. However, the use of a charge control cap in the embodiments of FIGS. 8*a* and 8*b* is only exemplarily. Other means for directing the ozone gas to the specimen, such as the feed pipe 36 in combination with a nozzle unit 38 arranged close to the specimen 28 as described previously could also be used. Pumps 44*a*-44*d* are arranged in order to create different levels of vacuum in the vacuum chambers 11*a*-11*d*. The chambers of different vacuum levels are separated by apertures 46*a*-46*c*. Typically, the vacuum level in the source chamber 11*a*, i.e. the chamber comprising the source of the charged particle beam device, is higher than the vacuum level in the lower chambers such as specimen chamber 11*d*.

Figure 8C:
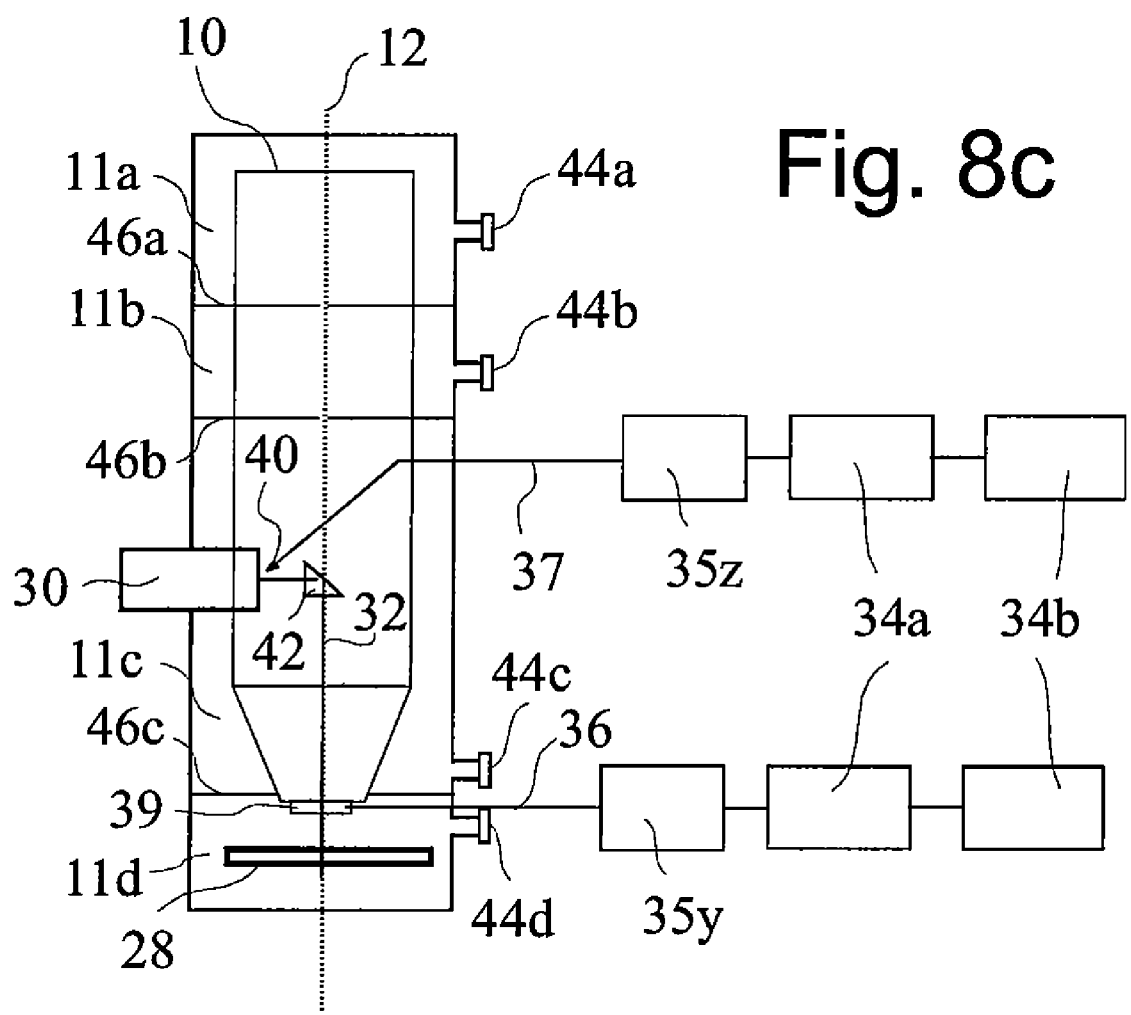

According to the embodiments shown in FIG. 8*c*, gas is directed to the detector and the specimen. Instead of different supplies 34*a*, 34*b* and/or gas flow controllers 35*y*, 35*z*, the feed pipe 36 and the feed pipe 37 could be connected to a common gas supply, for instance a common ozone generator.

Typically, the vacuum chambers 11*a*-11*d*, provide for a different level of vacuum with the highest level in the source chamber 11*a* and the lowest level in specimen chamber 11*d*. Hence, in these embodiments, it is typical that the higher the chamber is arranged, i.e. the closer to the source, the higher the vacuum level is.

Figure 9A:
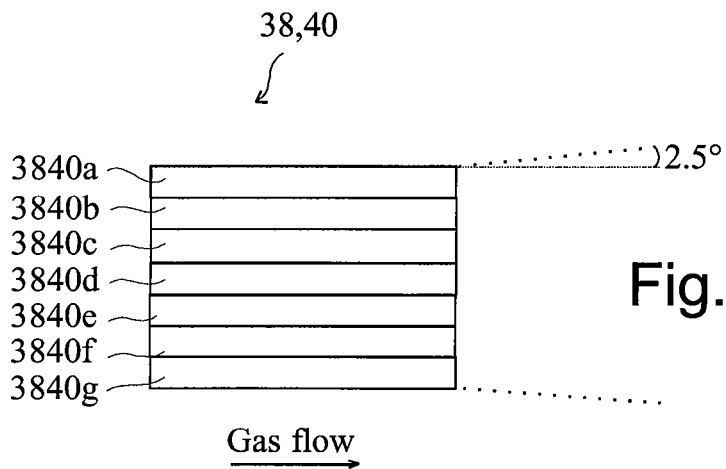
FIGS. 9a-9c show embodiments of nozzle units.
Figure 9B:
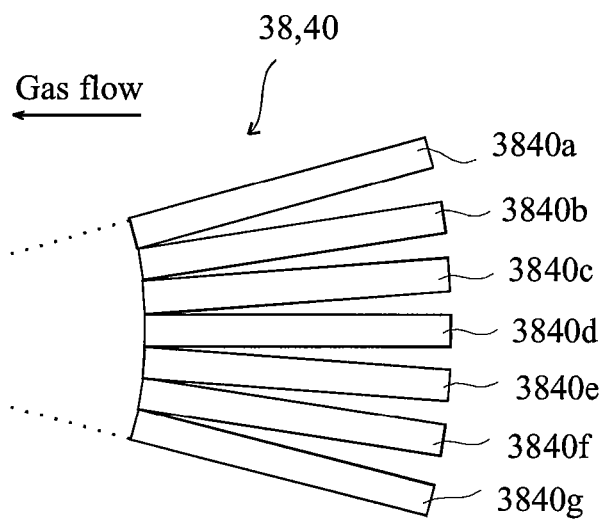
Figure 9C:
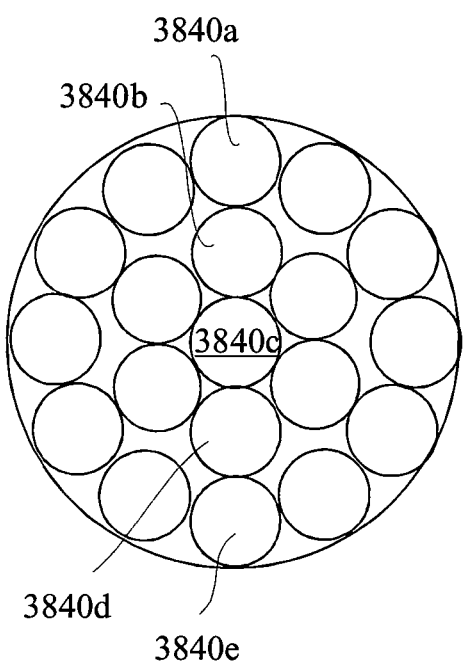

FIGS. 9*a*-9*c* show further embodiments of nozzle units which can be used as specimen nozzle unit and/or detector nozzle unit. In general, in all embodiments of the present invention, a standard nozzle unit can be used. Such a nozzle unit can also be the opening of a small diameter pipe. In the context of the present application, each opening that allows for generating a directed gas flow to the environments is to be understood as a nozzle unit.

Typically, a nozzle unit comprises the connection port to a feed pipe and an outlet opening for directing the gas flow to the environments. Typically, the outlet opening is opposite the feed pipe port. Moreover, the diameter of the feed pipe port is typically larger than the diameter of the outlet opening. According to embodiments of nozzle units, the diameter decreases steadily from the feed pipe port towards the outlet opening.

Alternatively to the nozzle units described above, nozzle units as described in the following drawings may be used in embodiments of the present invention. FIGS. 9*a* and 9*b* show a longitudinal section of nozzle units whereas FIG. 9*c* shows a cross section of the nozzle units according to FIGS. 9*a*-9*b*. As shown in FIG. 9*a*, the nozzle unit 38 or 40 may comprise an array of capillary tubes. According to the embodiment of FIG. 9*a*, these tubes are arranged in parallel to each other. In general, and not limited to this embodiment, the diameter size of the capillary tubes is typically in the range of a few 8 m. The gas beam aperture angle of a nozzle unit having a capillary structure as shown in FIG. 9*a* can be adjusted to values smaller than 10°. Even values of 3° or even 2.5° are possible. This is indicated in FIG. 9*a* by dotted lines. This allows for the enhanced control of the gas flow diffusion resulting in a better protection of sensitive parts of the charged particle beam from aggressive gases like ozone or oxygen.

According to the embodiment shown in FIG. 9*b*, the array of capillary tubes is arranged such that the axes of the capillaries are oriented vertically to a spherical shape. In general, the longitudinal axes of the capillary tubes, i.e. the axes that correspond to the gas flow direction within the capillary tubes, may be arranged such that they intersect each other in the gas flow direction. This way, the gas flow can be focused. In the embodiment shown in FIG. 9*b*, the capillary tubes are arranged essentially symmetrically. Thus, the longitudinal axes of the capillary tubes will intersect at a point to the left of the drawing. By applying a nozzle unit having a capillary structure with the capillary structure providing for a focusing property, the gas flow can be directed to the location where it is needed. This location may be the detector surface and/or the specimen. Due to the focusing property, gas beam aperture angles of between 0° and −15° can be achieved. That is, in contrary to the gas flow being exhausted from a nozzle unit without capillary structure, the overall gas flow diameter is smaller after the outlet of the capillary tubes than the diameter of the tubes at the outlet position. In FIG. 9*b*, the pointed gas flow is indicated by doted lines. Diffusion of the gas atoms and/or molecules to the environments can be further reduced by applying pump arrangements and pumping sections such as described before with regard to FIGS. 7*a*-7*c*, FIGS. 8*a*-8*b* and combinations thereof.

FIG. 9*c* shows a cross section of the nozzle unit as shown in FIGS. 8*a*-8*b*. In FIG. 8*a*, this cross section could be taken all along the capillary tubes. In FIG. 8*b*, however, the cross section is taken at the outlet side of the nozzle unit where the capillary tubes are close to another. The overall shape of the nozzle unit as well as the shape of the capillary tubes is circular in FIG. 9c. This is, however, to be understood exemplarily. All other shapes of the nozzle unit and the capillary tubes such as ellipsoid, rectangular or other polygonal shapes are also possible. In particular, limited space within the column or between focus lens and specimen may require specific nozzle unit shapes. If the capillary tubes are inclined to each another, typical inclination angles are between 2° and 15°, e.g. 3° or 5°.

In general, the specimen nozzle unit may comprise several specimen nozzles which direct an ozone gas flow to the specimen. Further, in general, the detector nozzle unit may comprise several detector nozzles which direct a gas flow to the detector. Accordingly, the feed pipes may comprise a plurality of feed pipe branches. Further, in general, it is possible that the nozzle unit is partially or completely integrated into an optical device such as an electrode, e.g. a deflector or a stigmator. An embodiment with a specimen nozzle unit having several specimen nozzles is exemplarily illustrated in FIGS. 10a and 10b which are described in the following.

Figure 10A:
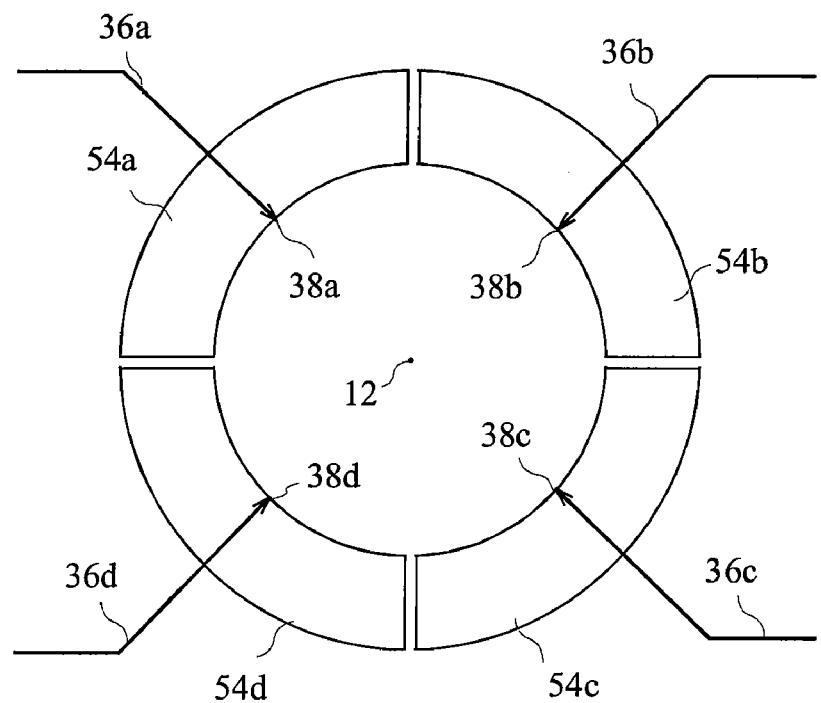
FIGS. 10a-10b shows a further embodiment of a detector nozzle unit.

FIG. 10a shows a quadrupole configuration of electrodes 54a-54d which are arranged symmetrically around the optical axis 12 of the charged particle beam device between the specimen and the focus lens, such as a magnetic lens. In general, further multipole configurations such as quadrupole, hexapole or octupole configurations could be applied. The electrodes are connected to a voltage source (not shown) providing one ore more voltages. In general, and not limited to this embodiment, the electrodes may be arranged between focusing lens and specimen. Further, also in general, the electrodes may act as deflector, stigmator, or a combination thereof; they may also generate an axial acceleration or deceleration field.

In FIG. 10a, the plurality of specimen nozzles 38a-38d is integrated into the electrodes. That is, the ozone gas flow is directed through the feed pipe branches 36a-36d, that are partially integrated in the electrodes 54a-54d, to the specimen nozzles 38a-38d where they are directed towards the specimen.

Figure 10B:
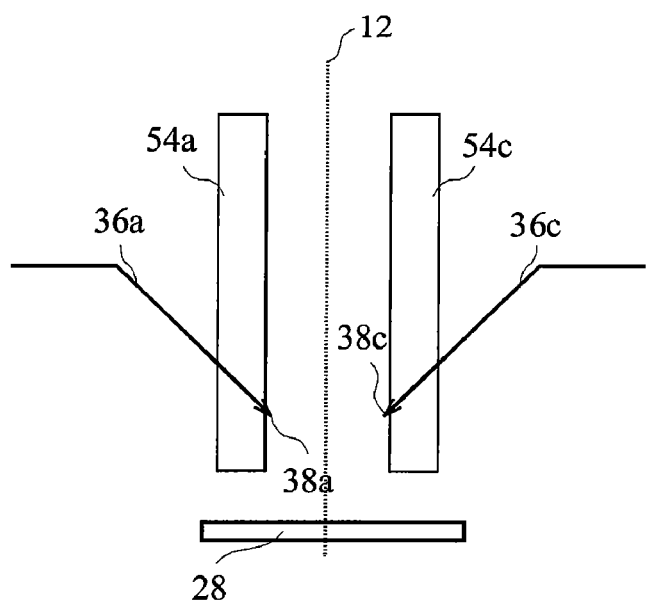

FIG. 10b shows a cross section of the embodiment of FIG. 10a parallel to the optical axis 12.

Thus, the present invention provides an improved charged particle beam device and a method of operating thereof allowing for the reduction of specimen and/or detector charging and/or contamination. Typically, the charged particle beam device according to the present invention can be applied in the mask inspection and mask metrology where both charging and contamination, in particular of the mask, can be an issue. Further, the present invention provides a charged particle beam device and a method of operating thereof which is particularly applied in electron beam inspection where high detection current densities are an issue.

The invention claimed is:

1. Charged particle beam device for irradiating a specimen, comprising:
   a particle source for providing a beam of charged particles;
   an optical device for directing the beam of charged particles onto the specimen;
   a detector; and
   a gas unit adapted for reducing the charging and/or contamination of the detector, the unit comprising:
      a supply of gas; and
      a detector nozzle unit adapted for directing a gas flow to the detector.

2. Charged particle beam device according to claim 1, wherein irradiating the specimen is modifying the specimen.

3. Charged particle beam device according to claim 1, wherein irradiating the specimen is imaging the specimen.

4. Charged particle beam device according to claim 1, further comprising a specimen nozzle unit for directing a gas flow to the specimen.

5. Charged particle beam device according to claim 1, further comprising a supply of ozone.

6. Charged particle beam device according to claim 5, wherein the supply of ozone comprises an ozone generator.

7. Charged particle beam device according to claim 6, wherein the ozone generator is provided with a supply of oxygen.

8. Charged particle beam device according to claim 5, wherein the supply of ozone comprises a reservoir with liquid or gaseous ozone.

9. Charged particle beam device according to claim 1, wherein the optical device is one or more elements selected from the group consisting of:
   at least one focus lens for focusing the charged particle beam onto the specimen;
   at least one deflector for deflecting the charged particle beam; and
   at least one condenser lens for influencing the charged particle beam.

10. Charged particle beam device according to claim 1, further comprising:
    a specimen table for mounting the specimen thereon; and/or
    a tilt mechanism for tilting the specimen and/or the charged particle beam.

11. Charged particle beam device according to claim 1, wherein the detector nozzle unit comprises a plurality of capillary tubes.

12. Charged particle beam device according to claim 4, wherein the specimen nozzle unit comprises a plurality of capillary tubes.

13. Charged particle beam device according to claim 11, wherein the capillary tubes are inclined to each other for generating a focused gas flow.

14. Charged particle beam device according to claim 4, wherein the detector nozzle unit and/or the specimen nozzle unit comprises a plurality of nozzles.

15. Charged particle beam device according to claim 1, wherein the supply of gas comprises at least one gas flow controller.

16. Charged particle beam device according to claim 15, wherein the at least one gas flow controller is connected to at least one sensor.

17. Charged particle beam device according to claim 16, wherein the at least one sensor is adapted for sensing at least one item selected from the group consisting of: a changing behavior of a sample, a detector current density, a process of exchanging samples, and a signal of the detector.

18. Charged particle beam device according to claim 5, wherein the gas comprises at least 0.1% and at most 10% of ozone.

19. Charged particle beam device according to claim 1, further comprising a vacuum chamber.

20. Charged particle beam device according to claim 19, further comprising at least one pump for extracting gas from the vacuum chamber.

21. Charged particle beam device according to claim 20, wherein the at least one pump extracts gas from the vicinity of the specimen surface and/or detector surface.

22. Charged particle beam device according to claim 1, further comprising at least one differential pumping section.

23. Charged particle beam device according to claim 1, further comprising a specimen chamber and an aperture for separating an optical column from the specimen chamber.

24. Method for irradiating a specimen, comprising:
   providing a charged particle beam;
   directing the charged particle beam onto the specimen;
   detecting secondary charged particles from the specimen with a detector; and
   reducing the charging and/or contamination of the detector by directing a gas flow to the place where detecting of the secondary charged particles takes place.

25. Method according to claim 24, further comprising: directing a gas flow to the specimen.

26. Method according to claim 24, wherein irradiating the specimen comprises imaging the specimen.

27. Method according to claim 24, wherein irradiating the specimen comprises modifying the specimen.

28. Method according to claim 24, further comprising one or more of the following steps:
   directing the charged particle beam through at least one lens;
   deflecting the charged particle beam;
   scanning the charged particle beam; and
   varying an angle between the specimen and the charged particle beam.

29. Method according to claim 25, wherein the gas flow is an ozone gas flow.

30. Method according to claim 29, wherein a share of ozone in the ozone gas flow is at least 0.1% and at most 10%.

31. Method according to claim 25, wherein directing the gas flow comprises using a detector nozzle unit and/or a specimen nozzle unit.

32. Method according to claim 25, wherein directing the gas flow comprises using a plurality of capillary tubes.

33. Method according to claim 25, wherein directing the gas flow comprises using a plurality of detector nozzles and/or specimen nozzles.

34. Method according to claim 32, wherein the capillary tubes are inclined to each other.

35. Method according to claim 24, further comprising: extracting gas from the vicinity of the specimen and/or the detector.

36. Method according to claim 31, further comprising:
   providing different vacuum levels between the specimen and a place where the charged particle beam is created.

37. Method according to claim 36, wherein the providing of different vacuum levels is accomplished by operating at least one pumping section.

38. Method according to claim 24, further comprising: controlling the gas flow.

39. Method according to claim 38, wherein controlling the gas flow comprises adjusting a nozzle unit size and/or a pressure of a gas supply.

40. Method according to claim 38, wherein controlling the gas flow is such that the gas flow is continuous or pulsating.

41. Method according to claim 38, wherein the gas flow is controlled by a device for controlling the gas flow, wherein the device controls the gas flow dependent on at least one signal from a sensor.

42. Method according to claim 41, wherein the sensor senses at least one characteristic item selected from the group consisting of: a charging behavior of a sample, a detector current density, an exchange of the sample, and a reduction of a detector signal.

* * * * *

UNITED STATES PATENT AND TRADEMARK OFFICE
CERTIFICATE OF CORRECTION

PATENT NO. : 7,629,578 B2
APPLICATION NO. : 11/675260
DATED : December 8, 2009
INVENTOR(S) : Frosien et al.

Page 1 of 1

It is certified that error appears in the above-identified patent and that said Letters Patent is hereby corrected as shown below:

Column 12, Lines 28-30, please delete "In general, and not limited to this embodiment, the diameter size of the capillary tubes is typically in the range of a few 8 m.".

Signed and Sealed this
Twenty-fifth Day of October, 2011

David J. Kappos
*Director of the United States Patent and Trademark Office*